(12) United States Patent
Johnson et al.

(10) Patent No.: US 7,475,374 B1
(45) Date of Patent: Jan. 6, 2009

(54) CLOCK GRID DRIVEN BY VIRTUAL LEAF DRIVERS

(75) Inventors: Scott C. Johnson, Round Rock, TX (US); Don Walters, Austin, TX (US); Ravinder Rachala, Austin, TX (US); Jerry Moench, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 427 days.

(21) Appl. No.: 11/314,698

(22) Filed: Dec. 20, 2005

(51) Int. Cl.
*G06F 17/50* (2006.01)
*G06F 9/45* (2006.01)

(52) U.S. Cl. .................. 716/10; 716/6; 716/8
(58) Field of Classification Search ........... 716/8–10, 716/12–14
See application file for complete search history.

(56) References Cited

U.S. PATENT DOCUMENTS

| | | | |
|---|---|---|---|
| 6,311,313 B1 | 10/2001 | Camporese et al. | |
| 6,496,966 B1 * | 12/2002 | Barney et al. | 716/10 |
| 6,696,863 B2 | 2/2004 | Yamamoto et al. | |
| 6,730,540 B2 | 5/2004 | Siniaguine | |
| 6,769,104 B2 | 7/2004 | Rodgers et al. | |
| 6,897,699 B1 | 5/2005 | Nguyen et al. | |
| 6,941,532 B2 | 9/2005 | Haritsa et al. | |
| 7,353,487 B1 * | 4/2008 | Bergendahl et al. | 716/17 |
| 2001/0025368 A1 | 9/2001 | Cooke et al. | |
| 2003/0101423 A1 | 5/2003 | Thorp | |
| 2003/0163750 A1 | 8/2003 | Trivedi et al. | |
| 2004/0017242 A1 | 1/2004 | Ie | |
| 2004/0068626 A1 | 4/2004 | Alpert et al. | |
| 2004/0108876 A1 | 6/2004 | Fairbanks | |
| 2004/0156591 A1 | 8/2004 | Zheng et al. | |
| 2004/0237060 A1 | 11/2004 | Igarashi et al. | |
| 2005/0082675 A1 | 4/2005 | Salcido et al. | |
| 2005/0114820 A1 * | 5/2005 | Restle | 716/13 |
| 2005/0251775 A1 * | 11/2005 | Wood | 716/10 |
| 2006/0053395 A1 * | 3/2006 | Lai et al. | 716/6 |
| 2007/0033560 A1 * | 2/2007 | Johnston | 716/6 |
| 2007/0106969 A1 * | 5/2007 | Birch et al. | 716/6 |
| 2007/0157144 A1 * | 7/2007 | Mai et al. | 716/10 |

* cited by examiner

*Primary Examiner*—Stacy A Whitmore
*Assistant Examiner*—Magid Y Dimyan
(74) *Attorney, Agent, or Firm*—Robert C. Kowert; Meyertons, Hood, Kivlin, Kowert & Goetzel, P.C.

(57) ABSTRACT

Various embodiments of methods and systems for providing virtual leaf driver nodes in a clock tree to drive a clock grid of an integrated circuit are disclosed. An integrated circuit may include a large number of clocked elements such as registers, flip-flops, etc. whose operation is synchronized by one or more clocks. For example, an operation performed by circuitry on one side of the die may need to occur at precisely the same time as another operation performed by circuitry on the other side of the die. In order to assure synchronicity of these events, a clock grid may be provided in the IC that is driven by virtual leaf driver nodes. The clock tree driving the clock grid may include a tier of leaf buffers. The output of a leaf buffer may be split, and the branches of the output connected to separate points on the clock grid.

31 Claims, 12 Drawing Sheets

CLOCK GRID DRIVEN BY VIRTUAL LEAF DRIVERS

BACKGROUND OF THE INVENTION

1. Field of the Invention

This invention is related to the field of integrated circuits, and more particularly, to driving a clock grid of an integrated circuit.

2. Description of the Related Art

Integrated circuit (IC) technology typically includes complex logic core designs that rely on one or more clocks for operational synchronization. Some of the desirable qualities for a clock signal may be an extremely small period, very short rise and/or fall times, low jitter, available everywhere on the chip with very low skew, and the ability to drive heavy loads at any point on the chip, while consuming the least possible amount of power.

One common approach to the design of clock distribution circuitry is a "tree" of buffered runs in which the number of buffers from the origin of the clock signal to any particular "leaf" node is kept constant in order to minimize skew. FIG. 1 illustrates the hierarchical organization of such a conventional buffer tree. The primary buffer fans out to a second tier of buffers, while each of the second tier buffers fans out to a third tier of buffers, etc. until the required number of drivers is achieved in the final tier. Therefore, the number of tiers of buffers between the primary driver and any leaf of the tree is constant. Additionally, the length of conductor runs between buffering levels is maintained consistent by "snaking" shorter runs to achieve equivalent characteristics to worst-case paths.

In order to assure uniform drive capability and minimize skew throughout the grid, a symmetric organization of the driving buffer tree is commonly applied. FIG. 2 illustrates one commonly applied routing pattern known as an "H-tree". The outputs from the buffers of a given tier are applied to the centers of the cross bars of the "H's" of the corresponding tier. Using an H-tree pattern, both the number of buffers and the total conductor run length between the primary buffer and any leaf node may be held constant. The outputs of the final tier or leaf buffers may be directly connected to the closest nodes or intersection points on the clock grid. The clock skew at the input of a consuming device may be proportional to the distance from the nearest driven point on the grid.

Another common architectural technique is to have a clock tree include a final tier of buffers that drive nodes of a grid or mesh. The output of a clock source, such as an oscillator or phase locked loop (PLL) that generates a reference clock signal, may be input to a clock tree composed of tiers of buffers. The buffers included in the final tier of the clock tree may be referred to as leaf buffers since they are the endpoints of the buffer tree. FIG. 3 illustrates a conventional clock buffer tree. The clock buffer tree of FIG. 3 routes clock signals into a mesh made up of conductive traces from two metal layers, M1 and M2. The leaf buffers drive clock signals to the M2 traces, which connect to the orthogonal M1 traces at the grid nodes. Any logic that needs the clock signal may tap into one of the M1 traces of the grid at the closest point to its location on the chip. As with the other two approaches discussed above, differences in the amount of skew may be exhibited between two different points on the grid, depending upon each point's respective distance from the nearest leaf buffer.

FIG. 4 illustrates elements of a portion of a conventional clock grid as they may appear within an IC. The horizontal elements with no hatching labeled "clock tree" may represent a tree of buffers (FIGS. 1 and 2) that carry the clock signal to the inputs of leaf buffers (represented as non-shaded triangles in FIG. 4) in the final tier of a clock tree. As illustrated in FIG. 4, the outputs of the leaf buffers may be directly connected to the clock grid. Horizontal clock grid lines M1, shaded with vertical hatching, may be connected to the vertical elements at each intersection point. The actual connection between the clock grid lines and the vertical elements may be represented by the solid squares shown at each intersection point. Note that there may be clock grid lines that are hidden by the horizontal clock tree elements and that the pattern of the clock grid elements as depicted may be extended to cover a much larger section, or in some cases the entire IC.

The output of a leaf buffer may be directly connected to one of the traces forming the clock grid represented by an M2 line. Since clock consumers may only be attached to the M1 layer, the clock signal must travel along the M2 feeder element from the output of the leaf buffer to the intersecting connection with the clock grid line M1 to which the consumer is attached, and then along the M1 element to the attach point. Delay along this path may cause the edge of the clock signal at the consumer to lag that of the output of the leaf and this delay may differ between two consumers at different points on the grid. For example, the delay from the output of a leaf buffer to the input of a clock consumer at attach point 1 may be slight whereas that from output of a leaf buffer to the input of a clock consumer at attach point 2 may be several times as great. The skew thus introduced between clock signals feeding logic at various attach points may limit the operating frequency of the IC.

SUMMARY

The use of virtual leaf driver nodes to drive a clock grid of an integrated circuit may, in some embodiments, reduce and help normalize the amount of clock signal skew experienced at different locations on the clock grid. An integrated circuit may include a large number of clocked elements such as registers, flip-flops, etc. whose operation is synchronized by one or more clocks. For example, an operation performed by circuitry on one side of the die may need to occur at precisely the same time as another operation performed by circuitry on the other side of a die for an IC. In order to assure synchronization of these events, a clock grid driven by virtual leaf driver nodes may be provided in the IC. The clock tree driving the clock grid may include a tier of leaf buffers. The output of a leaf buffer may be split or ramified, and the branches of the output connected to separate points on the clock grid, according to some embodiments. The output of a leaf buffer may be split into virtually any number of signal paths each connecting the leaf buffer to one or more points distributed across the clock grid.

In one embodiment, the feeder paths along which the clock signal branches are routed from the output of the leaf buffer to their connection points on the clock grid may be the same length. In another embodiment, the feeder paths may be of different lengths, but the propagation delay experienced by the clock signal branch may be the same for all feeder paths connected to the output of a particular leaf buffer. The terminal end of each feeder path may be connected to a point on the clock grid, which serves as a virtual leaf driver node. By insuring that the propagation delay for each feeder element is the same, the skew of the clock signal from one virtual leaf driver node to another may be eliminated. Note that clock signal skew may still exist between the output of the leaf buffer and the outputs of the corresponding virtual leaf driver nodes, however when measured relative to one another the outputs of the virtual leaf driver nodes may be in phase.

Therefore, the maximum skew between points on the clock grid in a region surrounding the virtual leaf driver nodes may be significantly decreased as compared to that of a system in which the corresponding leaf buffer is connected to the grid at a single point.

In some embodiments, the load attached to the portion of the clock grid driven by one leaf buffer may be greater than that attached to a different portion of the clock grid. In one embodiment, the registers of the circuitry attached to both portions of the grid may be positive-edge triggered and the tolerable clock skew attributable to waveform distortion may be constant. The leaf buffer driving the lighter load may produce an output waveform that meets the clock skew requirement using a weaker pull-up transistor than that in the buffer driving the portion of the clock grid to which the heavier load is connected. The same relationship may hold true for falling-edge triggered logic and the pull-down transistors of leaf buffers. By tailoring the relative strengths of leaf buffer output transistors based on the load being driven and the type of edge utilized by the logic in a particular portion of an IC, substantial savings in power consumption and/or real estate may be realized.

BRIEF DESCRIPTION OF THE DRAWINGS

A better understanding of the present invention can be obtained when the following detailed description is considered in conjunction with the following drawings, in which.

Figure 1:
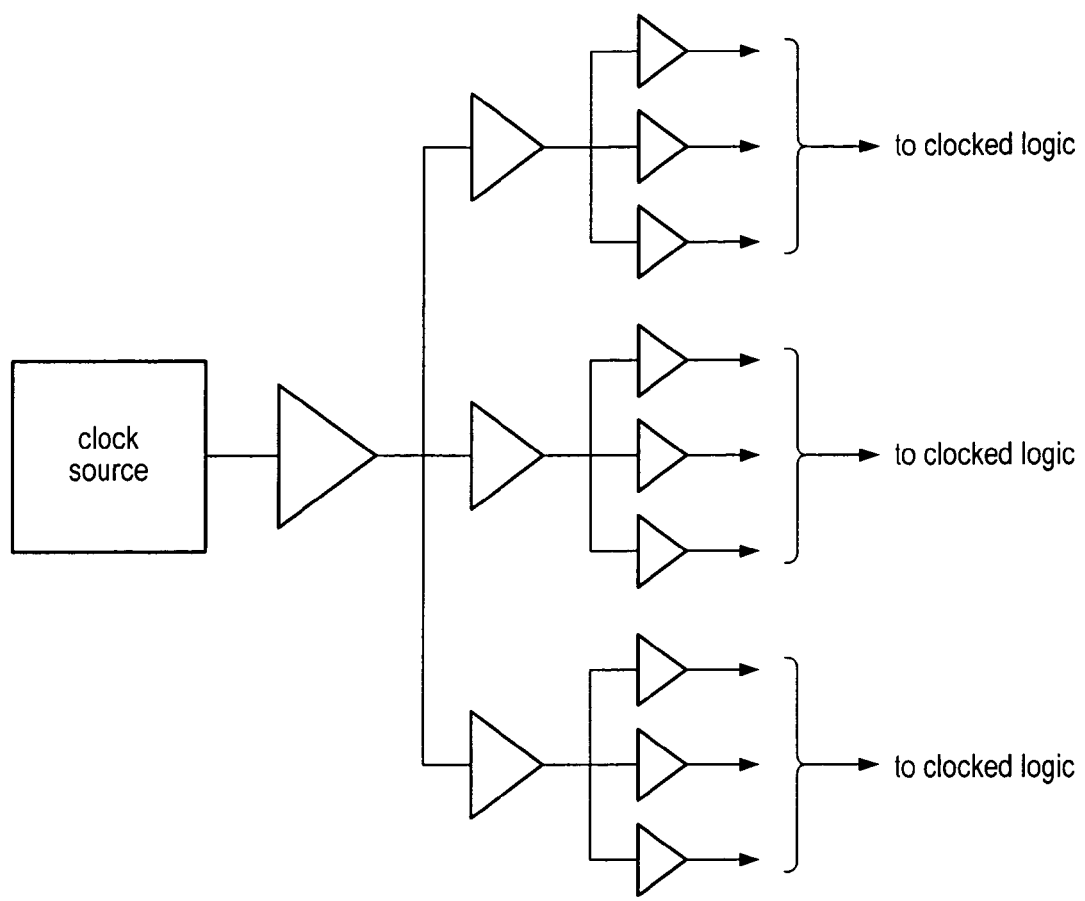
FIG. 1 illustrates the hierarchical organization of a conventional buffer tree.
Figure 2:
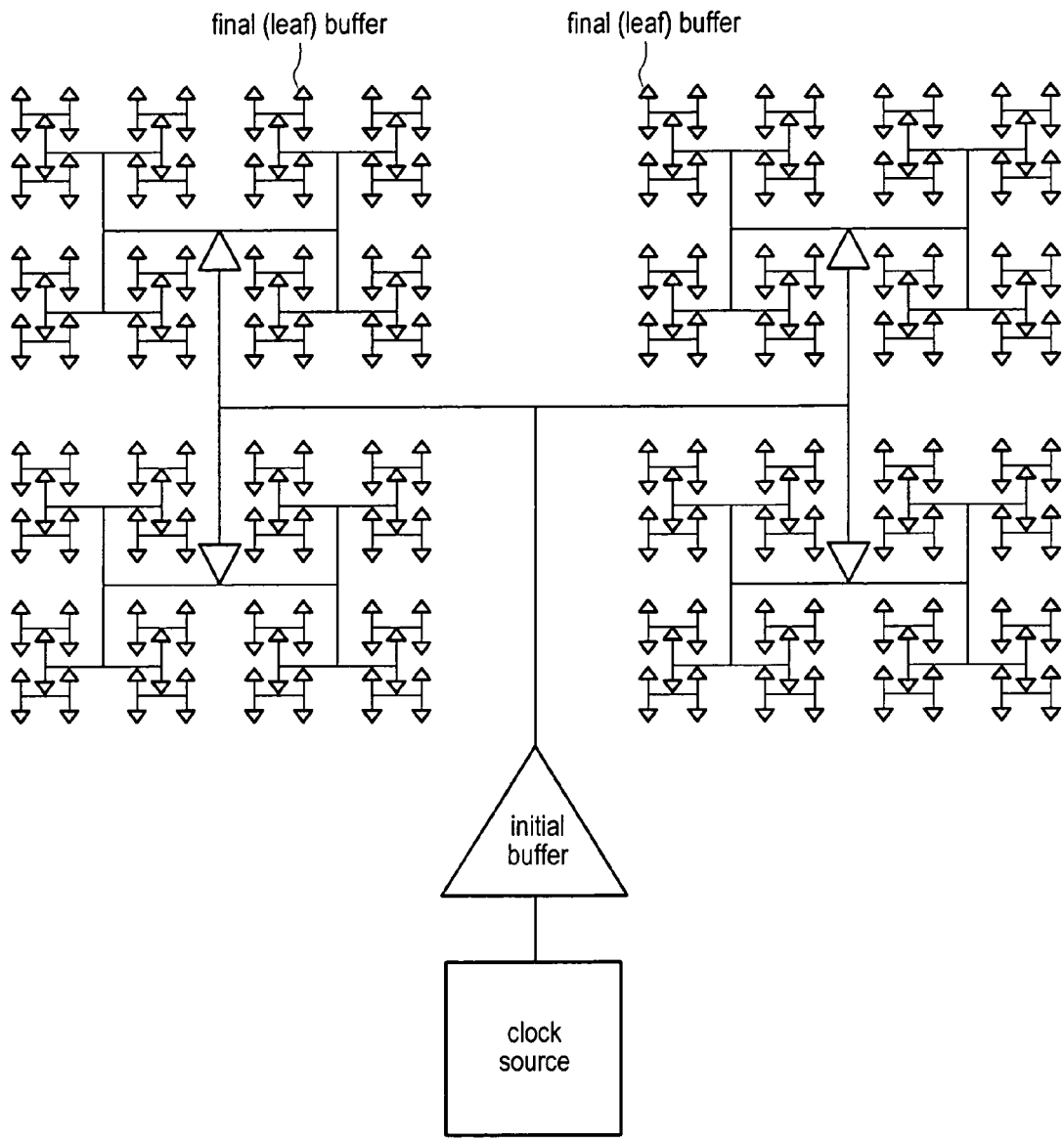
FIG. 2 illustrates one commonly applied routing pattern known as an "H-tree".
Figure 3:
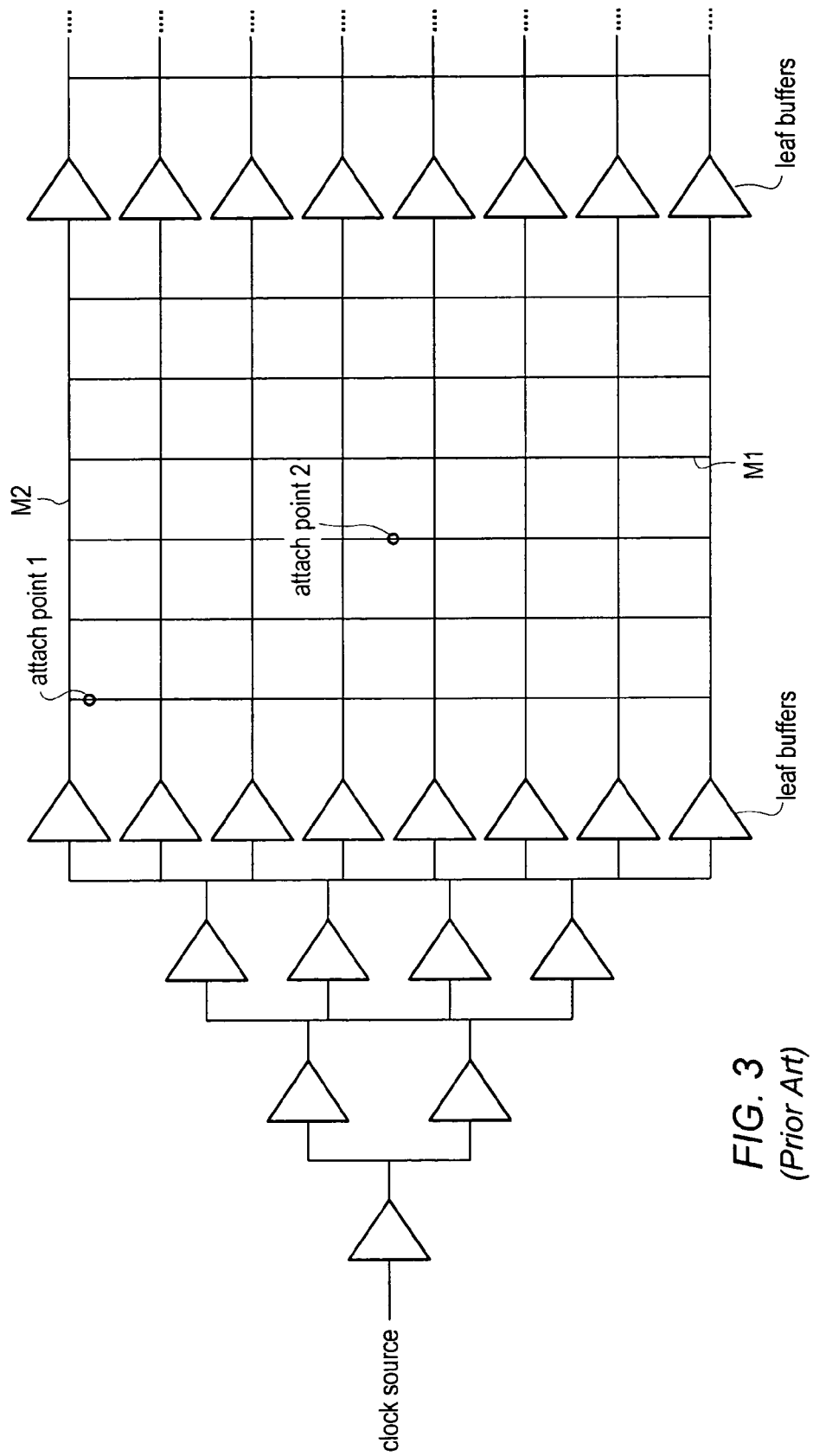
FIG. 3 illustrates a conventional clock buffer tree feeding into a mesh made up of conductive traces from two metal layers.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must). The term "include" and derivations thereof mean "including, but not limited to." The term "connected" means "directly or indirectly connected," and the term "coupled" means "directly or indirectly coupled."

DETAILED DESCRIPTION OF EMBODIMENTS

In many IC designs, the area devoted to clock tree buffers may be limited and therefore the number of groups of leaf buffers available to drive clock grid lines may also be limited. Examples of such designs may be complex microprocessors or multi-core processor chips. At the same time it may be desirable to include many clock grid lines in these designs in order to minimize the average distance from a clock consuming functional block to a clock grid connection point. It may also be desirable to operate such ICs at the maximum possible clock rate, thus minimizing the design's tolerance for clock skew. In some embodiments, the use of virtual leaf driver nodes may allow a leaf buffer to drive a number of clock grid lines with minimal skew between the different clock grid lines.

Figure 5:
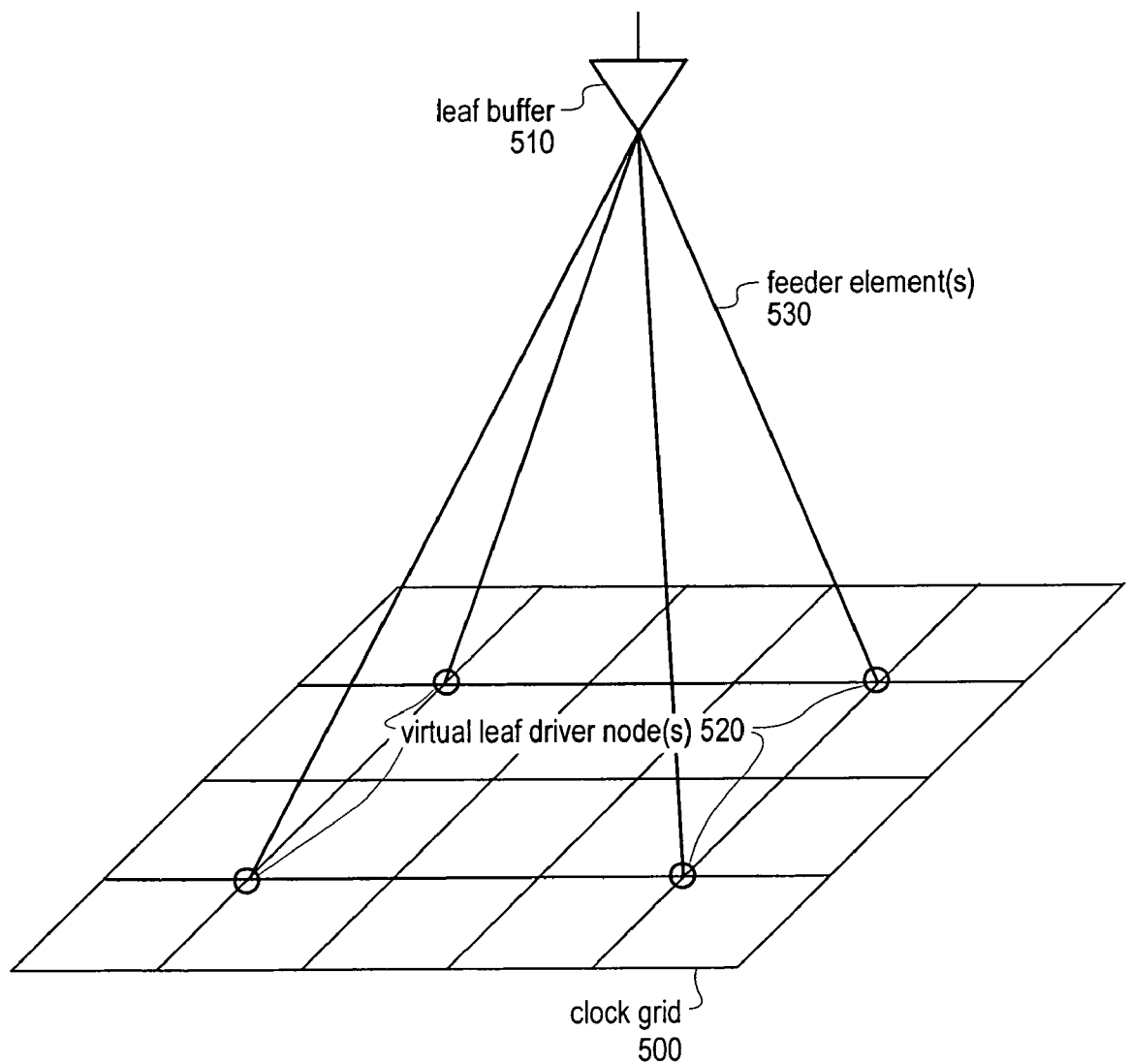
FIG. 5 illustrates a technique for routing the output of a leaf buffer to clock grid elements to reduce the skew between the clock signals on the grid lines, according to one embodiment.

FIG. 5 illustrates a technique for routing the output of a leaf buffer to clock grid elements that may reduce clock signal skew between different points on the clock grid, according to one embodiment. Rather than being connected directly to any particular grid line of the clock grid, according to some embodiments the output of a leaf buffer, such as leaf buffer 510, may be connected to multiple feeder elements 530. In turn, each feeder element 530 may be connected to a clock grid line or a crossing of two grid lines, according to certain embodiments. A point on the clock grid to which a feeder element is connected may be referred to as a virtual leaf driver node, such as the four virtual leaf driver nodes 520 illustrated in FIG. 5.

By ensuring that the propagation delay for each feeder element is the same, such as by making each feeder element trace of the same length, the skew of the clock signal from one virtual leaf driver node to another may be substantially eliminated. Note that clock signal skew may still exist between the output of the leaf buffer and the outputs of the corresponding virtual leaf driver nodes, however, when measured relative to one another, the outputs of different virtual leaf driver nodes may be in phase. Therefore, the maximum skew between any two points on the clock grid in a region surrounding the virtual leaf driver nodes may be significantly decreased as compared to that of a system in which the corresponding leaf buffer is connected to the grid at a single point. Please note that for ease of description, FIG. 5 illustrates only a single leaf buffer connected to a clock grid via only four virtual leaf buffer nodes. Other embodiments, however, may include a much larger clock grid driven by a large number of leaf buffers connected via many more signal paths to virtual leaf driver nodes.

Figure 6:
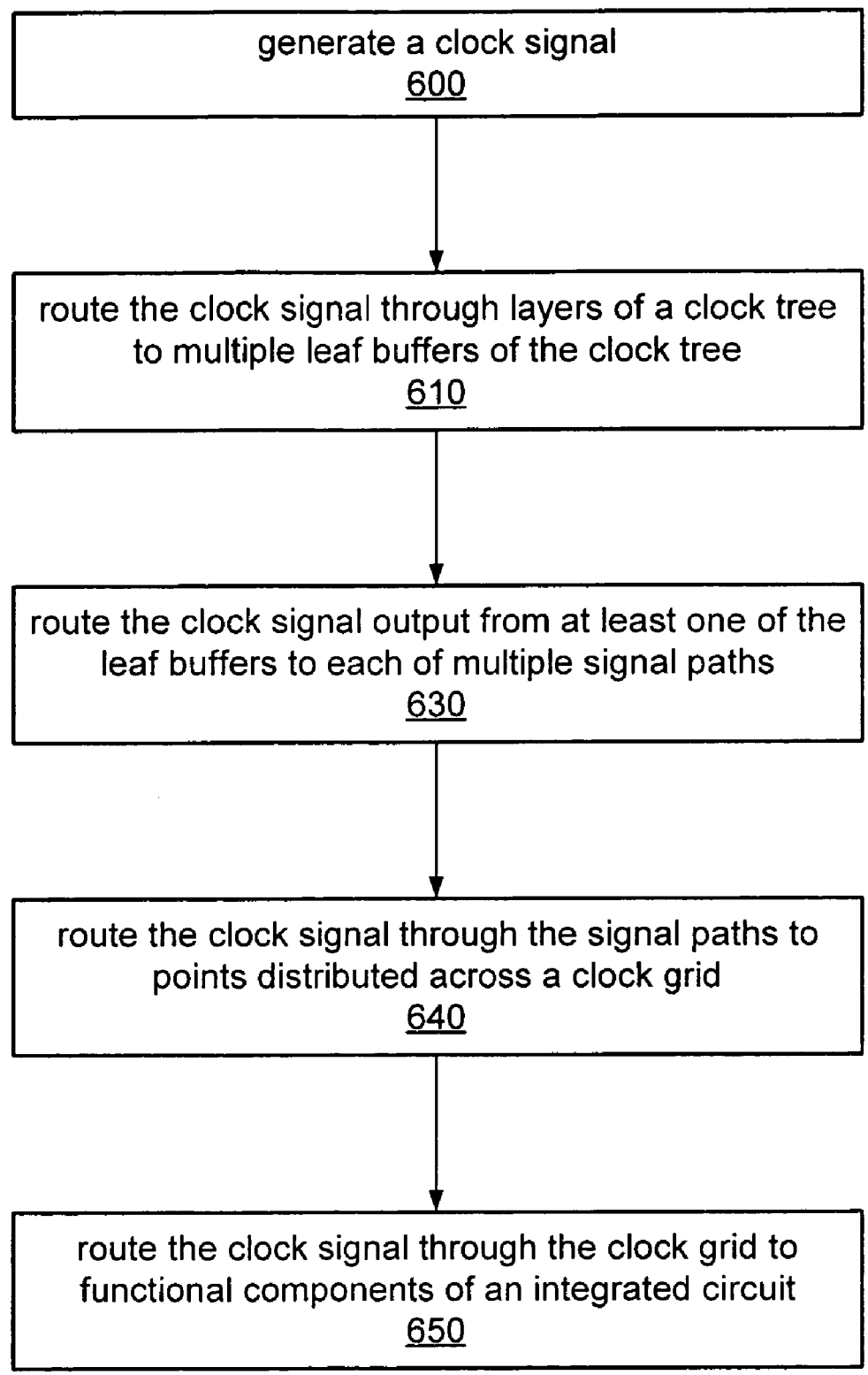
FIG. 6 illustrates one embodiment of a method for driving a clock grid using virtual leaf driver nodes, as described herein.

FIG. 6 illustrates one embodiment of a method for driving a clock grid with virtual leaf drivers, according to one embodiment. As illustrated by block 600, a clock signal is generated, such as by an oscillator or phase locked loop, in some embodiments. The clock signal may be routed through various layers of a clock tree to a plurality of leaf buffers of the clock tree, as illustrated by block 610. In order to drive a clock grid and reduce clock skew among various consumers of the clock signal, the clock signal output from at least one of the leaf buffers may be routed to multiple signal paths, as illustrated by block 630 and may also be routed through the signal paths to various points distributed across the clock grid. For example, as shown in FIG. 5 and discussed above, the output of a leaf buffer of a clock tree may be split and routed along different signal paths to different points on a clock grid. As noted above, the point or points at which the clock signal connects to the clock grid may be considered virtual leaf driver nodes and all the virtual leaf driver nodes driven by a single clock tree leaf buffer may be considered to be directly connected to the leaf buffer for the purposes of propagation delay and clock skew. In some embodiments, each of the signal paths between a leaf buffer and the clock grid may be routed to ensure that all of the signal paths are the same length. As noted above, having all the signal paths of equal length may reduce clock skew between different points of a clock grid.

The number and routing of the individual signal paths connecting a leaf buffer to a clock grid may take various forms, according to different embodiments. For example, in one embodiment, as illustrated by FIG. 5, the output of a leaf buffer may be routed directly to one or more virtual leaf node drivers at the clock grid. In other embodiments however, the output of a leaf buffer may be connected to one or more intermediate feeder elements, themselves connected to the various portions of the clock grid. Finally, the clock signal may be routed along the clock grid to various function components of an integrated circuit or other clock signal consuming components, as illustrated by block 650.

Please note that the individual steps and processes described above regarding FIG. 6 for driving a clock grid with virtual leaf driver nodes represent only exemplary embodiments. Other embodiments may include fewer or additional steps and/or processes or may perform some of the above steps in a different order than described herein.

Figure 4:
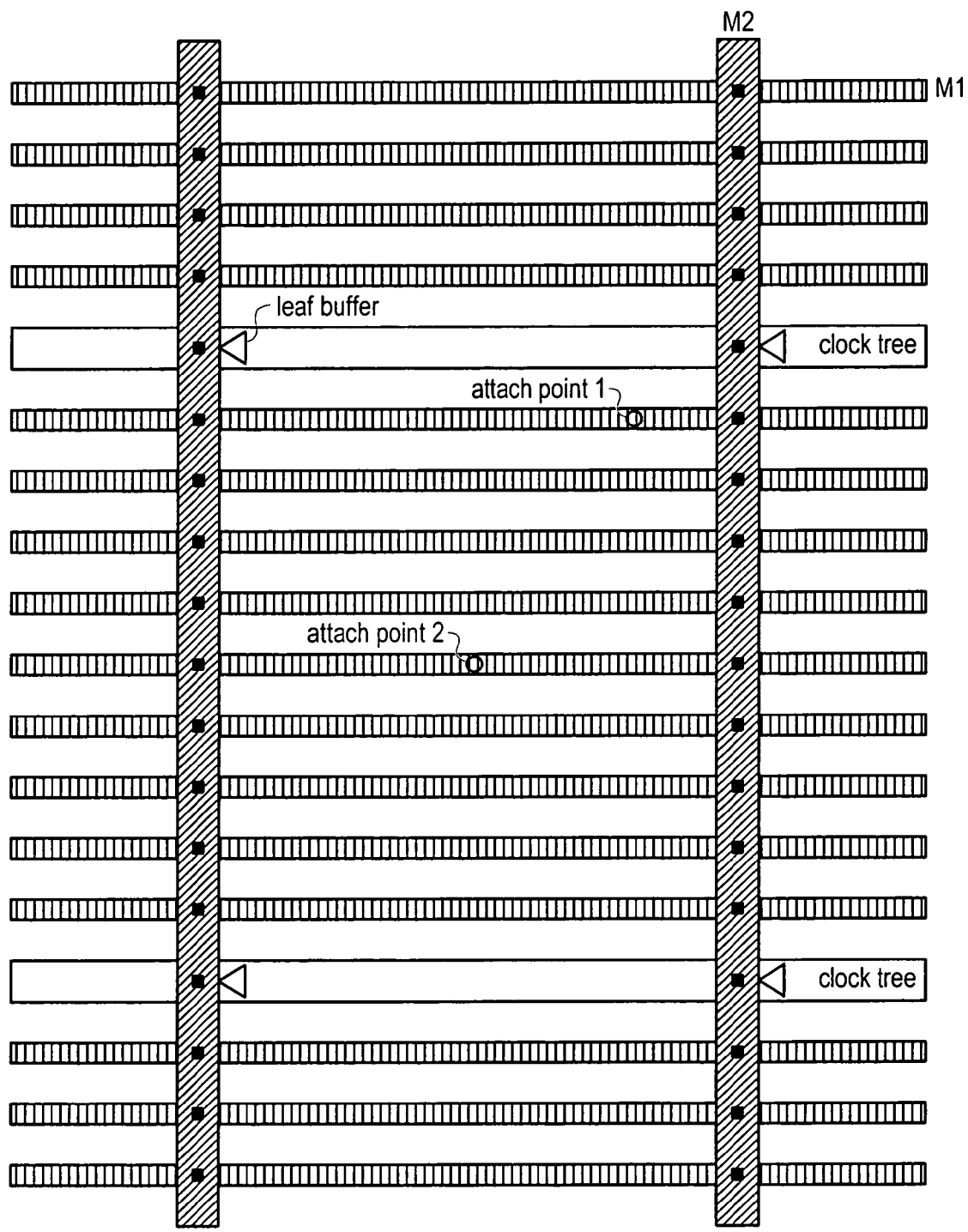
FIG. 4 illustrates elements of a portion of a conventional clock grid as they may appear within an IC.
Figure 7:
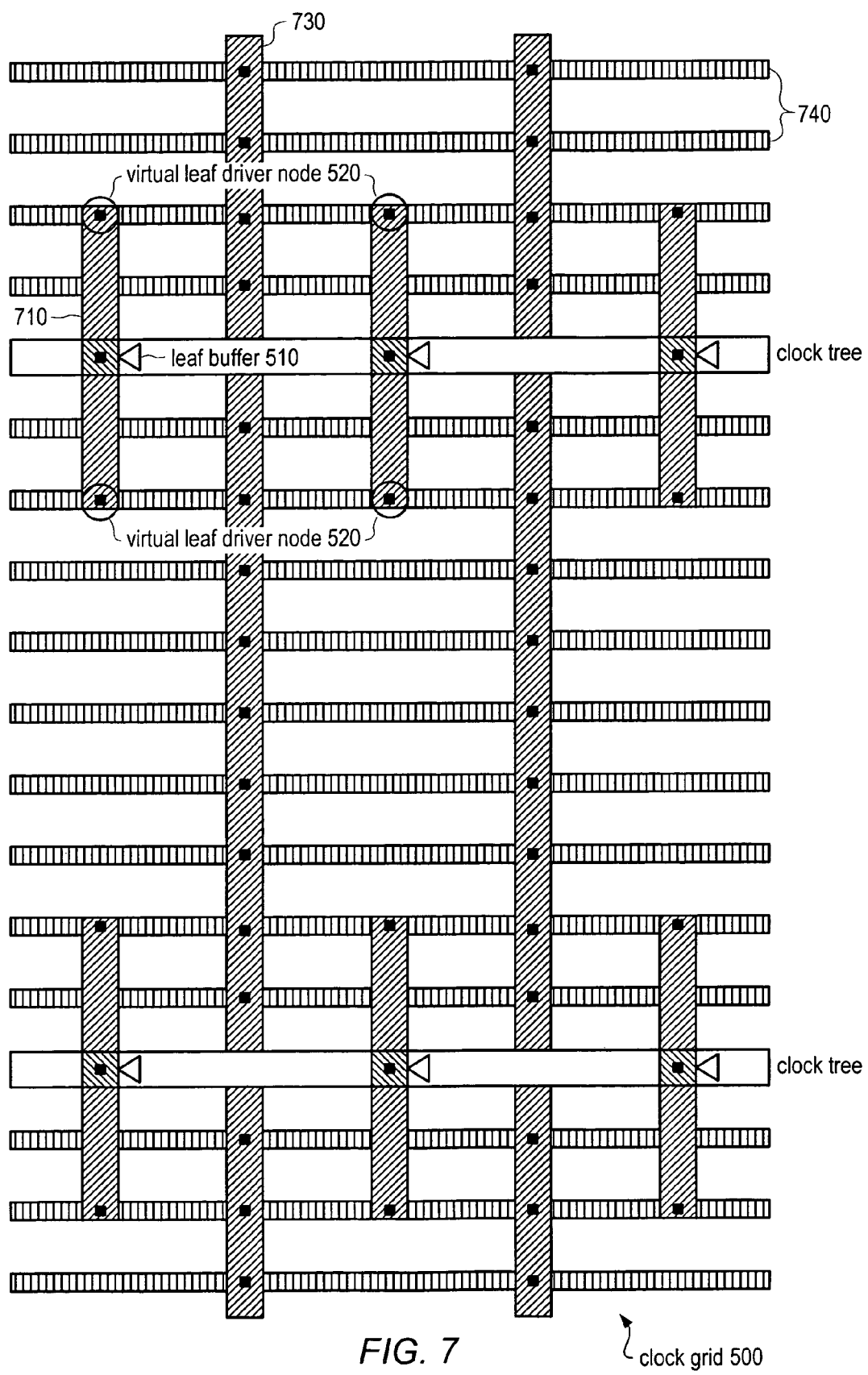
FIG. 7 illustrates an arrangement of elements feeding a clock grid for reducing clock skew as they may appear within an IC, according to one embodiment.

FIG. 7 illustrates an arrangement of elements feeding a clock grid for reducing clock skew as they may appear within an IC, according to one embodiment. As opposed to the clock grid illustrated in FIG. 4, discussed above, the leaf buffers 510 in FIG. 7 may not be directly connected to the virtual clock grid elements. Instead the leaf buffers may be connected to vertical feeder elements 710. The ends of the vertical feeders 710 may terminate in connections with horizontal grid lines 740, in some embodiments. The points on the horizontal grid lines 740 which connect to the vertical feeder 710 may be considered directly connected to the output of leaf buffer 510 for the purposes of determining clock signal skew between two consuming devices and may also be considered virtual leaf driver nodes 520.

Figure 8:
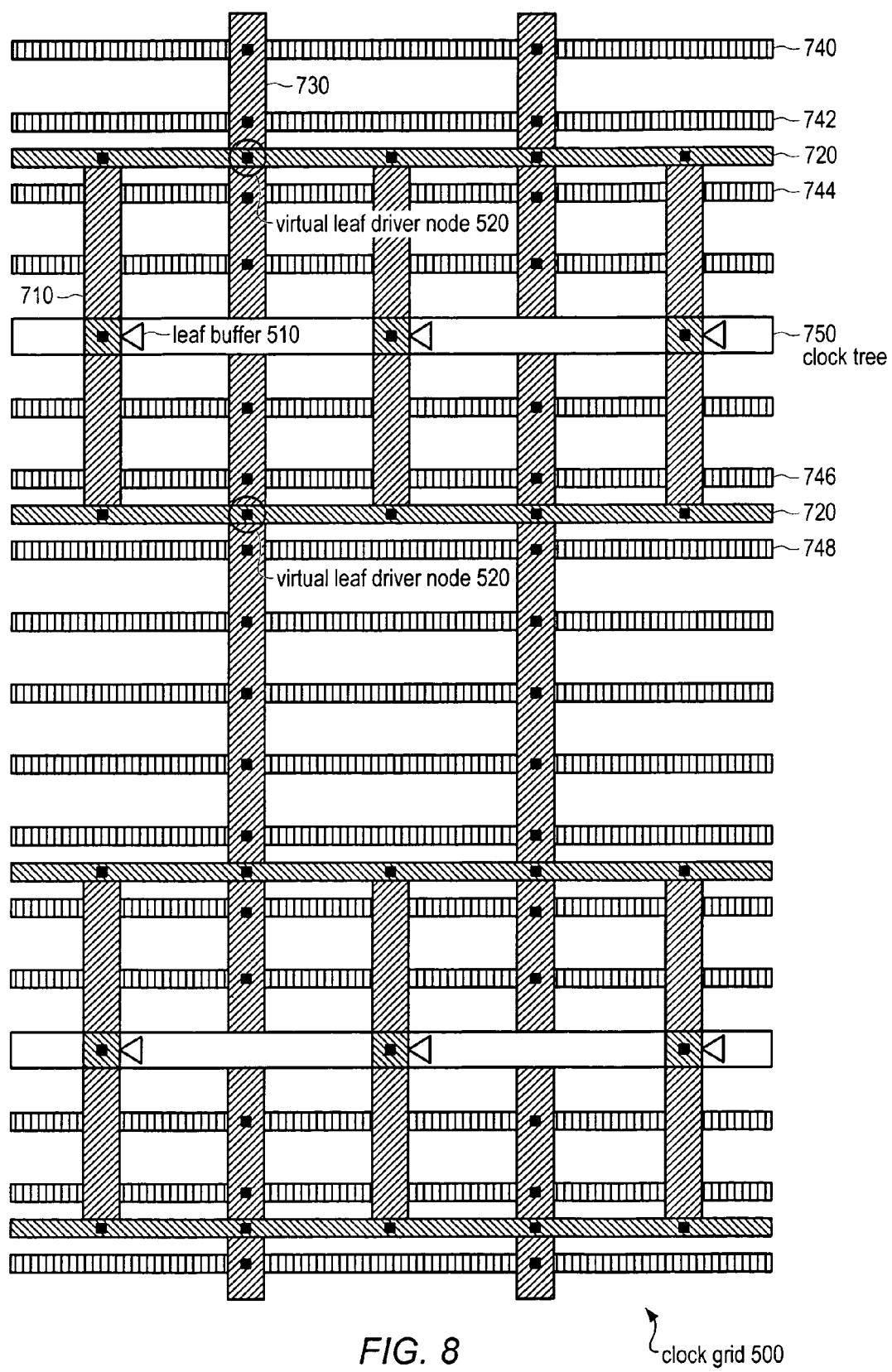
FIG. 8 illustrates an arrangement of elements of a clock grid for reducing clock skew, according to another embodiment.

While in the embodiment illustrated in FIG. 7, discussed above, the output of a leaf buffer may be routed along a vertical feeder element which connects directly to horizontal clock grid lines 740, in the embodiment illustrated in FIG. 8, the vertical feeder element 710 may terminate in connections with horizontal feeder elements 720, distinct from the clock grid lines 640. In some embodiments, these horizontal feeder elements 720 may also be connected to the vertical clock grid elements 730 at each point where the two intersect. In the embodiment illustrated by FIG. 7, the output of each leaf buffer 510 may be split in two and routed along a vertical feeder element 710 and two horizontal feeder elements 720 to two separate points on a single vertical clock grid element 730.

In some embodiments, the signal paths between a leaf buffer and a virtual clock grid element may be constructed such that the propagation delay is the same along each path. A vertical clock grid element 730 may be connected to each horizontal grid line 740 at intersection points between the two. If a horizontal feeder element is connected to a vertical clock grid element equidistant from two horizontal grid lines, the rising edge of a clock signal output from the leaf buffer may arrive at four horizontal grid lines simultaneously. For example, the output of leaf buffer 510 in FIG. 7 is connected to the center of vertical feeder element 710, each end of which is connected to a horizontal feeder element 720, which in turn is connect to virtual clock grid element 730 at two or more points, each of which is equidistant from two horizontal clock grid elements, such as horizontal clock grid elements 742, 744, 746 or 748. Thus, the output of leaf buffer 510 may have to travel an equal distance to reach each of the horizontal clock grid elements 742, 744, 746 and 748. Each of the points at which the vertical clock grid element 730 intersects and attaches to one of these four grid lines may be considered directly connected to the output of leaf buffer 510 for the purposes of determining clock signal skew between two consuming devices. These four intersection points may be referred to as virtual leaf driver nodes 520. Thus, according to some embodiments, the number of grid lines between consecutive "driven" connection points along a vertical clock grid element for this arrangement may be reduced from that of some conventional designs, along with the average clock skew between two clock-consuming devices.

Figure 9:
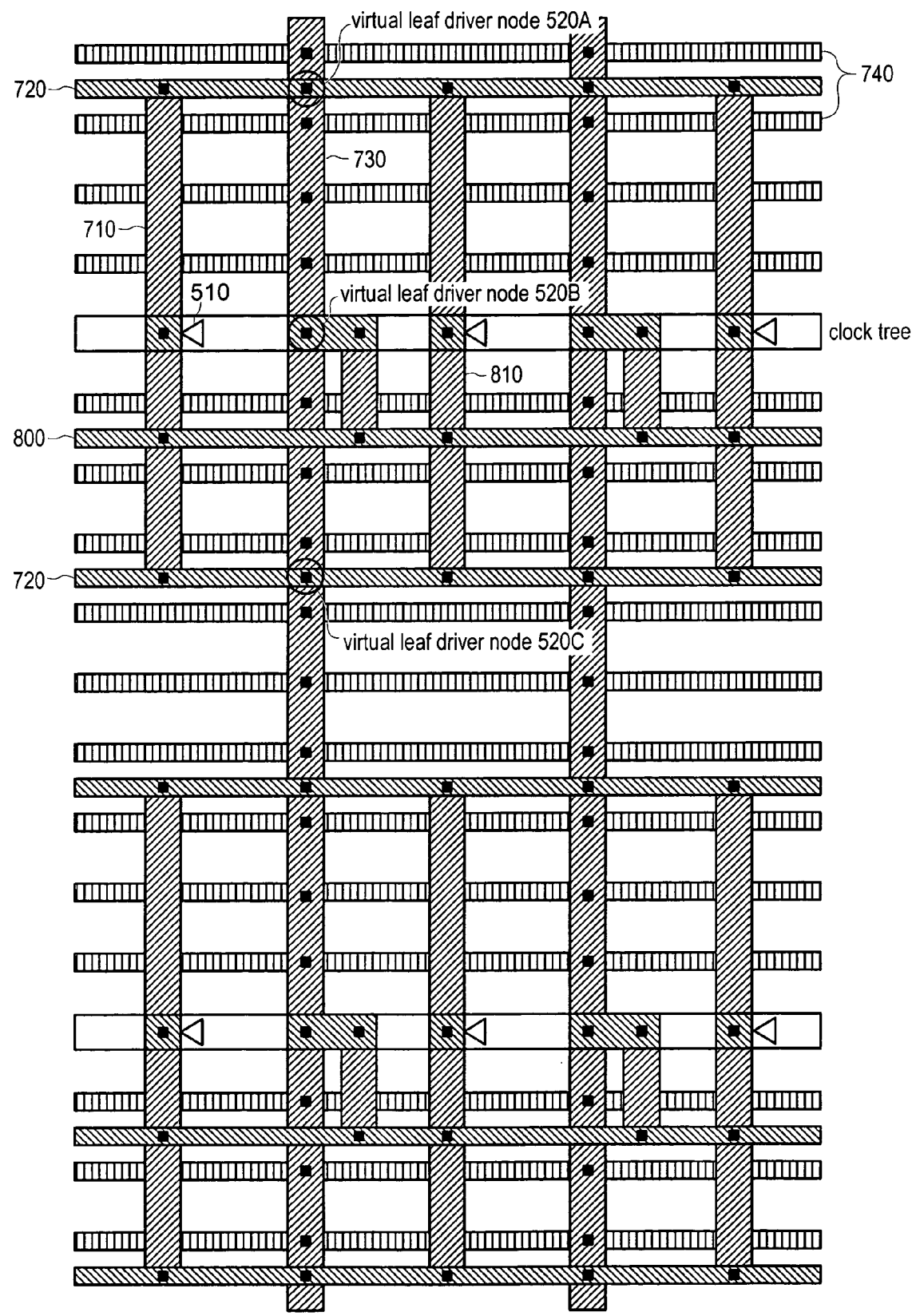
FIG. 9 illustrates an arrangement of elements of a clock grid for reducing clock skew, according to yet another embodiment.

FIG. 9 illustrates an arrangement of elements of a clock grid for reducing clock skew, according to yet another embodiment. As with the embodiment described above regarding FIG. 8, in the embodiment illustrated by FIG. 9 the leaf buffers may again directly drive vertical feeders rather than the vertical clock grid elements. The vertical feeder elements 710 may drive horizontal feeder elements 720, and the horizontal feeder elements may drive the vertical clock grid elements 730 to which the grid lines 740 are attached, according to some embodiments. Additionally, in some embodiments, additional horizontal 800 and vertical 810 feeder elements may be included to route the output of a leaf buffer 510 to an intersection with a vertical clock grid element 730 for connection to the underlying grid lines 740. In certain embodiments, these additional feeder elements 800 and 810 may be routed such that the propagation delay experienced by the output of a leaf buffer in traversing the additional feeder elements to a connection with a grid line 740 may be equal to the propagation delay of the signal that travels to a different grid line without traversing the additional feeder elements. In other words, the propagation delay for a signal output from leaf buffer 510 may be the same at virtual leaf driver node 520A as that at virtual leaf driver node 520B. This configuration for splitting and routing the output of leaf buffers to clock grid lines may, in some embodiments, reduce the average clock skew between two clock-consuming devices to a greater degree than the arrangement of FIG. 7 or 8.

Figure 10:
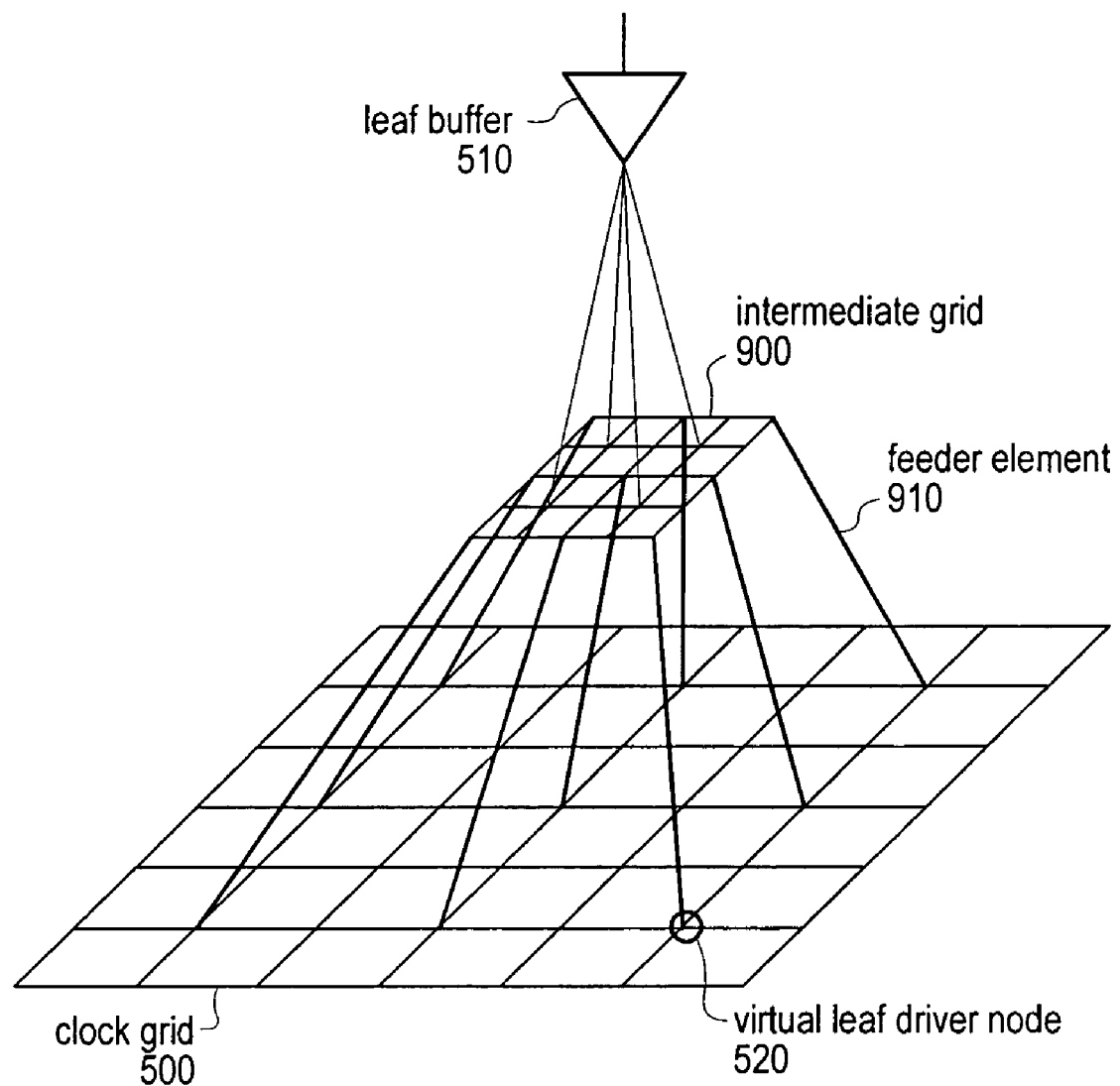
FIG. 10 illustrates one embodiment of a routing scheme for the output of leaf buffers in which the routing elements described above take the form of an intermediate grid.

Through circuitous routing or "snaking" of feeder runs, any number of clock grid lines may be connected to the output of a leaf buffer in such a way that the clock skew due to propagation delay between any two of the grid lines is zero, according to some embodiments. FIG. 10 illustrates one embodiment of a routing scheme for the output of leaf buffers in which the routing elements described above take the form of an intermediate grid. The output of the leaf buffer may be ramified and connected to the intermediate grid by feeder elements 910 at a number of points sufficient to make the relative clock signal skew between any two points on the intermediate grid negligible. Additional feeder elements may connect points on the intermediate grid to points on the clock grid. The points at which these feeder elements connect to the clock grid may serve as virtual leaf driver nodes. The extent of the intermediate grid may allow for the connection of a large number of feeders to the clock grid. This may in turn provide a high density of virtual clock drivers at the clock grid corresponding to a single leaf buffer. In this manner, the average clock signal skew between points on a clock grid in an area serviced by a leaf buffer may be reduced.

The concept of an intermediate grid may be extensible to any number of levels of intermediate grids. For instance, each of the feeder lines 910 of FIG. 10 may itself be connected to an additional intermediate grid from which multiple additional feeder elements connect the additional intermediate grid to points the clock grid lines. In some embodiments, instead of each of the feeder elements 910 directly connecting intermediate grid 900 to clock grid 500, additional vertical and horizontal feeder elements, such as illustrated in FIGS. 8 and 9, discussed above, may be included between a point on intermediate grid 900 and multiple clock grid lines. In general, various combinations of feeder elements and intermediate grids may be employed to provide a clock signal to multiple points in a clock grid while maintaining substantially equal signal propagation delay and skew between the points of the clock grid.

Another component of skew may be the distortion of the clock signal due to path impedance, loading, cross talk, etc. For example, a clock signal traveling from the output of a leaf buffer to a clock consumer or "load" may be distorted by a capacitive impedance which includes the input capacitance of the load along with the capacitance of the traces included in the signal paths from the buffer to the load. This capacitance may distort the signal by retarding rapid voltage changes. In embodiments in which the clock signal is a square wave, this may increase both the rise and fall times of the clock edges. The effect on the clock consumer of slowing the edges of the clock may be equivalent to delaying the arrival of the edge and may add to the skew. For example, for a clock source driving two rising edge sensitive loads, the second of which has a greater input capacitance than the first, even though the start of the rising edge may occur simultaneously at the inputs of the two devices, the trigger voltage at which the devices recognize the rising edge may occur significantly later for the second device than for the first. This may result from the change in voltage per unit time of the rising edge of the clock waveform being greater at the input of the second device than at the first.

The rise/fall time of the clock signal may be proportional to the capacitance described above as well as the output resistance of the driving buffer. When the pull-up transistor is on, the output of the buffer may be connected to the supply voltage Vdd through the on-resistance of the transistor. The time required to switch the output of the buffer from low to high may be proportional to the product of the on-resistance of pull-up transistor and the capacitance of the load that the buffer is driving. If the load capacitance is constant, a buffer with a pull-up transistor with lower on-resistance may switch its output more quickly in response to a rising edge of and input clock signal, than a buffer with higher on-resistance transistors.

If the amount of current that flows through a transistor for a given Vds and Vgs may be referred to as the "strength" of the transistor, then the strength of the transistor may be inversely proportionally to its on-resistance. The on-resistance of a transistor may be proportional to the ratio of W/L, where W represents the width of the transistor's source/drain channel, and L represents the length of the gate. Therefore, the strength of a transistor may be proportional to its W/L ratio.

For a square wave clock signal input to a leaf buffer, the slope of a rising edge of the output signal may be proportional to the strength of the pull-up transistor, while that of a falling edge may be proportional to the strength of the pull-down transistor. In some IC designs, large sections of clocked circuitry may include registers that respond to only the rising edge of the input clock. In one embodiment, the leaf buffers driving the clock signal to these areas of the IC may be constructed that the pull-up transistor is "stronger" (has a lower on-resistance and/or a larger W/L ratio) than the pull-down transistor. This may provide an output clock signal with rising edges of very high slope and falling edges of lesser slope to circuitry with relatively large capacitive loading. For embodiments in which the IC circuitry clocked on falling edges, leaf buffers may be supplied in which the pull-down transistors are stronger than the pull-up transistors.

In some embodiments, the load attached to the portion of the clock grid driven by one leaf buffer may be greater than that attached to a different portion of the clock grid. In one embodiment, the registers of the circuitry attached to both portions of the grid may be positive-edge triggered and the tolerable clock skew attributable to waveform distortion may be constant. The leaf buffer driving the lighter load may produce an output waveform that meets the clock skew requirement using a weaker pull-up transistor than that in the buffer driving the portion of the clock grid to which the heavier load is connected. The same relationship may hold true for falling-edge triggered logic and the pull-down transistors of leaf buffers. By tailoring the relative strengths of leaf buffer output transistors based on the load being driven and the type of edge utilized by the logic in a particular portion of an IC, substantial savings in power consumption and/or real estate may be realized.

Figure 11:
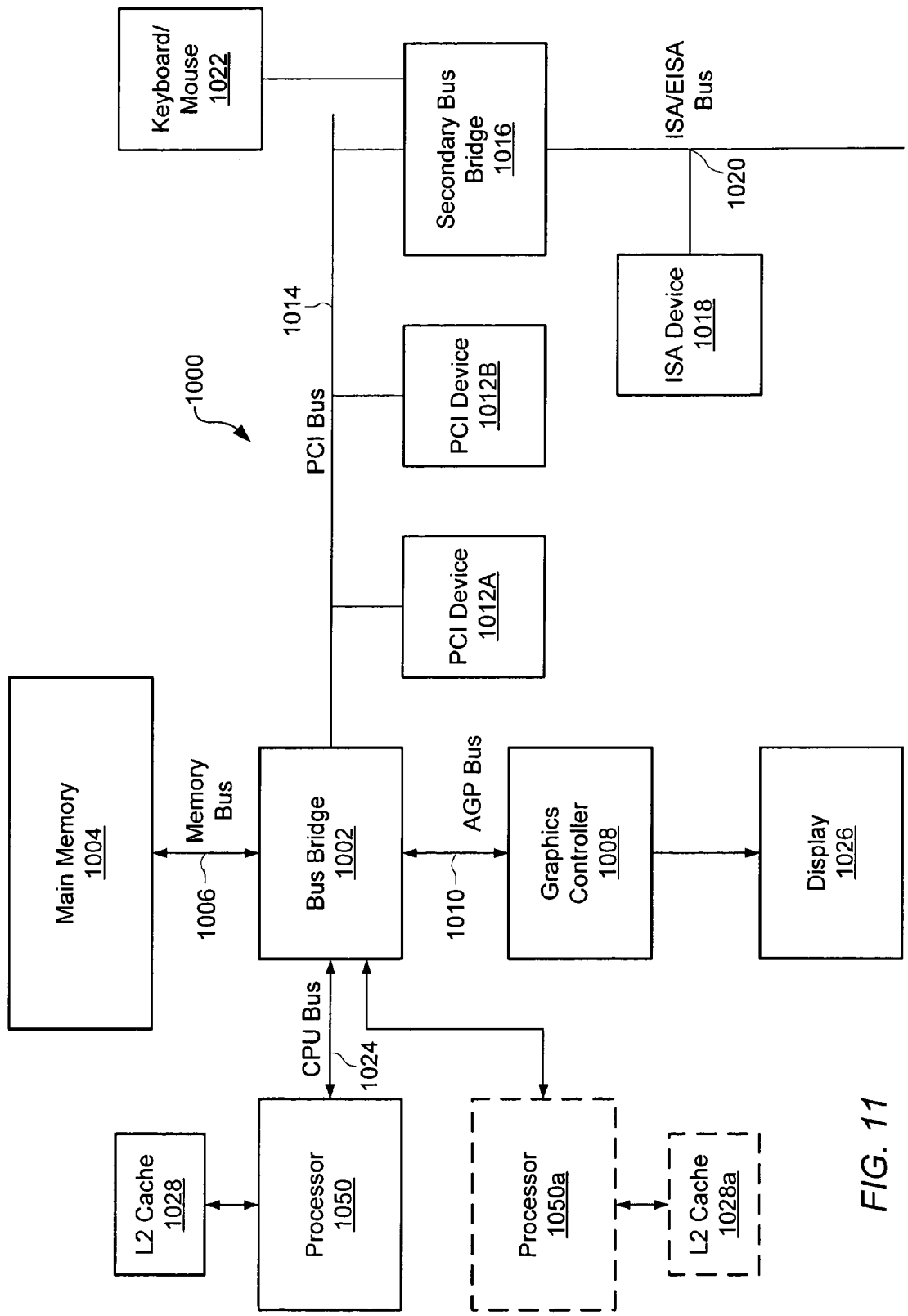
FIG. 11 shows a block diagram of one embodiment of an exemplary computer system.

FIG. 11 shows a block diagram of one embodiment of a computer system 1000 that includes a microprocessor 1050 coupled to a variety of system components through a bus bridge 1002. Microprocessor 1050 may include an embodiment of virtual leaf driver nodes as described above. Other embodiments of a computer system are possible and contemplated. In the depicted system, a main memory 1004 is coupled to bus bridge 1002 through a memory bus 1006, and a graphics controller 1008 is coupled to bus bridge 1002 through an AGP bus 1010. Several PCI devices 1011A-1011B are coupled to bus bridge 1002 through a PCI bus 1014. A secondary bus bridge 1016 may also be provided to accommodate, an electrical interface to one or more EISA or ISA devices 1018 through an EISA/ISA bus 1020. In this example, microprocessor 1050 is coupled to bus bridge 1002 through a CPU bus 1024 and to an optional L2 cache 1028. In some embodiments, the microprocessor 100 may include an integrated L1 cache (not shown).

Bus bridge 1002 provides an interface between microprocessor 1050, main memory 1004, graphics controller 1008, and devices attached to PCI bus 1014. When an operation is received from one of the devices connected to bus bridge 1002, bus bridge 1002 identifies the target of the operation (e.g., a particular device or, in the case of PCI bus 1014, that the target is on PCI bus 1014). Bus bridge 1002 routes the operation to the targeted device. Bus bridge 1002 generally translates an operation from the protocol used by the source device or bus to the protocol used by the target device or bus.

In addition to providing an interface to an ISA/EISA bus for PCI bus 1014, secondary bus bridge 1016 may incorporate additional functionality. An input/output controller (not shown), either external from or integrated with secondary bus bridge 1016, may also be included within computer system 1000 to provide operational support for a keyboard and mouse 1022 and for various serial and parallel ports. An external cache unit (not shown) may also be coupled to CPU bus 1024 between microprocessor 1050 and bus bridge 1002 in other embodiments. Alternatively, the external cache may be coupled to bus bridge 1002 and cache control logic for the external cache may be integrated into bus bridge 1002. L2 cache 1028 is shown in a backside configuration to microprocessor 1050. It is noted that L2 cache 1028 may be separate from microprocessor 1050, integrated into a cartridge (e.g., slot 1 or slot A) with the microprocessor, or even integrated onto a semiconductor substrate with the microprocessor.

Main memory 1004 is a memory in which application programs are stored and from which microprocessor 1050 primarily executes. A suitable main memory 1004 may include DRAM (Dynamic Random Access Memory). For example, a plurality of banks of SDRAM (Synchronous DRAM) or Rambus DRAM (RDRAM) may be suitable.

PCI devices 1011A-1011B are illustrative of a variety of peripheral devices such as network interface cards, video accelerators, audio cards, hard or floppy disk drives or drive controllers, SCSI (Small Computer Systems Interface) adapters and telephony cards. Similarly, ISA device 1018 is illustrative of various types of peripheral devices, such as a modem, a sound card, and a variety of data acquisition cards such as GPIB or field bus interface cards.

Graphics controller 1008 is provided to control the rendering of text and images on a display 1026. Graphics controller 1008 may embody a typical graphics accelerator generally known in the art to render three-dimensional data structures that can be effectively shifted into and from main memory 1004. Graphics controller 1008 may therefore be a master of AGP bus 1010 in that it can request and receive access to a target interface within bus bridge 1002 to thereby obtain access to main memory 1004. A dedicated graphics bus accommodates rapid retrieval of data from main memory 1004. For certain operations, graphics controller 1008 may further be configured to generate PCI protocol transactions on AGP bus 1010. The AGP interface of bus bridge 1002 may thus include functionality to support both AGP protocol transactions as well as PCI protocol target and initiator transactions. Display 1026 is any electronic display upon which an image or text can be presented. A suitable display 1026 includes a cathode ray tube ("CRT"), a liquid crystal display ("LCD"), etc.

It is noted that, while the AGP, PCI, and ISA or EISA buses have been used as examples in the above description, any bus architectures may be substituted as desired. It is further noted that computer system 1000 may be a multiprocessing computer system including additional microprocessors (e.g., microprocessor 1050a shown as an optional component of computer system 1000). Microprocessor 1050a may be similar to microprocessor 1050. More particularly, microprocessor 1050a may be an identical copy of microprocessor 1050 in one embodiment. Microprocessor 1050a may be connected to bus bridge 1002 via an independent bus or may share CPU bus 1024 with microprocessor 1050. Furthermore, microprocessor 100a may be coupled to an optional L2 cache 1028a similar to L2 cache 1028.

Various components illustrated in FIG. 11 may, according to some embodiments, include clock grids driven by virtual leaf driver nodes, as described herein. For example, processor 1050 may include a clock grid to supply a clock signal to various functional components within an integrated circuit of processor 1050, in one embodiment. As described above, a clock signal may be supplied to multiple points, such as virtual leaf driver nodes 520, of a clock grid for processor 1050 via one or more leaf buffers of a clock tree. Additionally, any of various manners of connecting the output of a leaf buffer to virtual lead driver nodes may be utilized when supplying a clock signal to a clock grid for processor 1050, according to various embodiments. For example, in one embodiment, the output of a leaf buffer may be ramified and directly connected to multiple points distributed across the clock grid. In another embodiment, additional feeder elements, such as the virtual and horizontal feeder elements described above regarding FIGS. 7, 8 and 9 may connect, at virtual leaf driver nodes, the output of a leaf buffer to grid lines of the clock grid. In yet another embodiment, the output of one or more leaf buffers may be routed to intermediate grid(s) for further distribution to a main clock grid, as described above regarding FIG. 10.

Similarly, other components of the of computer system illustrated in FIG. 11, such as bus bridge 1002, graphics controller 1008, and secondary bus bridge 1010, among others, may also include clock grids driven by virtual leaf driver nodes supplied by leaf buffers of a clock tree, as described herein. Different components may utilize different manners of connecting the output of a leaf buffer to a virtual leaf driver node of a clock grid, according to various embodiments. For example, bus bridge 1002 may include a clock grid which is driven by virtual leaf driver nodes connected to leaf buffers directly, while graphic controller 1008 may include multiple intermediate grids to distribute signals from leaf buffers to virtual leaf driver nodes, according to one embodiment. In general, any combination (and/or multiple combinations) of methods and manners for routing clock signals between leaf buffers and virtual leaf driver nodes may be utilized, according to certain embodiments.

Figure 12:
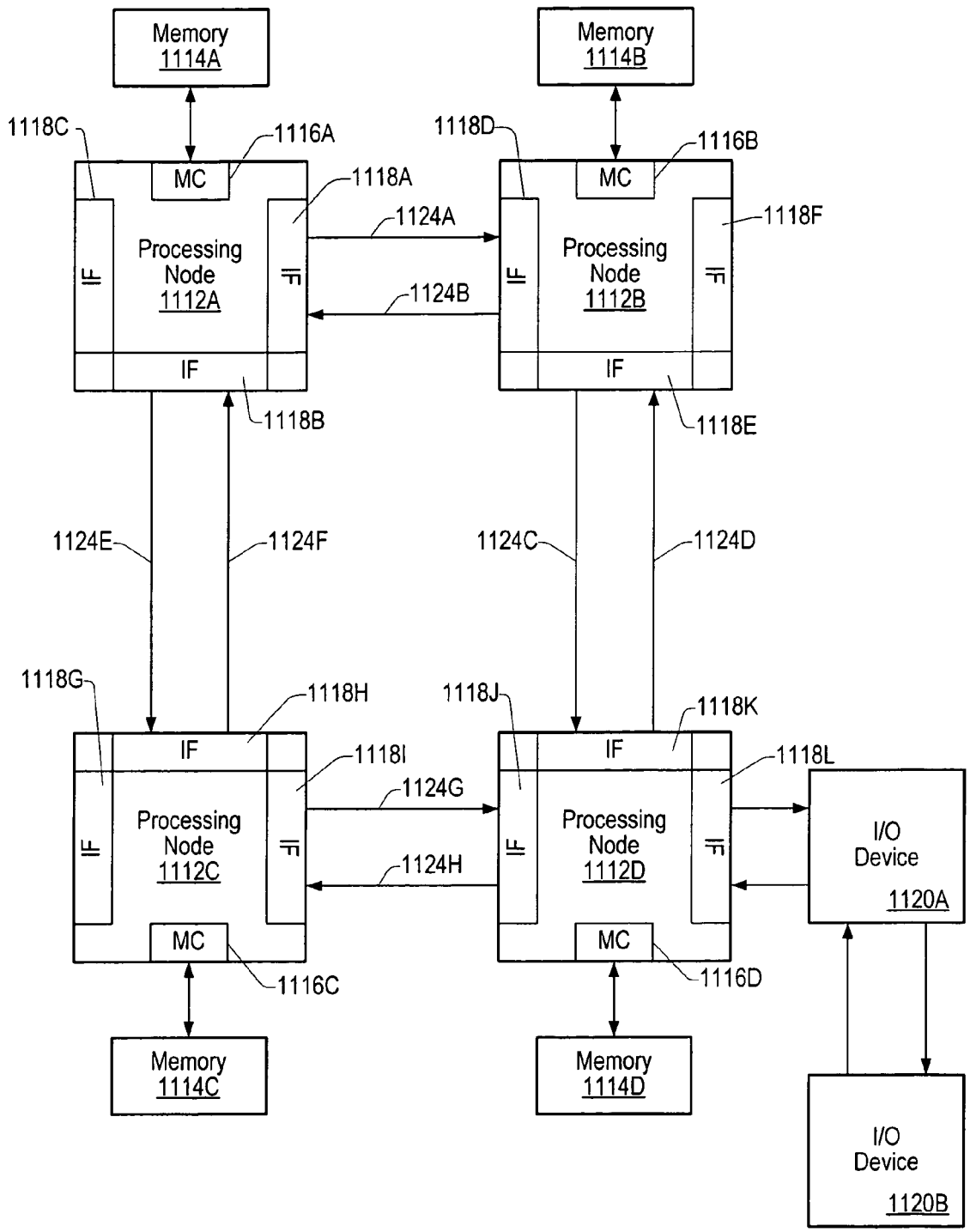
FIG. 12 shows a block diagram of an exemplary computer system, according to another embodiment.

Turning now to FIG. 12, another embodiment of a computer system that may include an embodiment of virtual leaf driver nodes as described above is shown. Other embodiments are possible and contemplated. In one embodiment, the computer system depicted in FIG. 12 may include several processing nodes 1112A, 1112B, 1112C, and 1112D. Each processing node is coupled to a respective memory 1114A-1114D via a memory controller 1116A-1116D included within each respective processing node 1112A-1112D. Additionally, processing nodes 1112A-1112D include interface logic used to communicate between the processing nodes 1112A-1112D. For example, processing node 1112A includes interface logic 1118A for communicating with processing node 1112B, interface logic 1118B for communicating with processing node 1112C, and a third interface logic 1118C for communicating with yet another processing node (not shown). Similarly, processing node 1112B includes interface logic 1118D, 1118E, and 1118F; processing node 1112C includes interface logic 1118G, 1118H, and 1118I; and processing node 1112D includes interface logic 1118J, 1118K, and 1118L. Processing node 1112D is coupled to communicate with a plurality of input/output devices (e.g., devices 1120A-1120B in a daisy chain configuration) via interface logic 1118L. Other processing nodes may communicate with other I/O devices in a similar fashion.

Processing nodes 1112A-1112D implement a packet-based link for inter-processing node communication. In the present embodiment, the link is implemented as sets of unidirectional lines (e.g., lines 1124A are used to transmit packets from processing node 1112A to processing node 1112B and lines 1124B are used to transmit packets from processing node 1112B to processing node 1112A). Other sets of lines 1124C-1124H are used to transmit packets between other processing nodes as illustrated in FIG. 11. Generally, each set of lines 1124 may include one or more data lines, one or more clock lines corresponding to the data lines, and one or more control lines indicating the type of packet being conveyed. The link may be operated in a cache coherent fashion for communication between processing nodes or in a non-coherent fashion for communication between a processing node and an I/O device (or a bus bridge to an I/O bus of conventional construction such as the PCI bus or ISA bus). Furthermore, the link may be operated in a non-coherent fashion using a daisy-chain structure between I/O devices as shown. It is noted that a packet to be transmitted from one processing node to another may pass through one or more intermediate nodes. For example, a packet transmitted by processing node 1112A to processing node 1112D may pass through either processing node 1112B or processing node 1112C. Any suitable routing algorithm may be used. Other embodiments of the computer system may include more or fewer processing nodes than the embodiment shown in FIG. 11.

Generally, the packets may be transmitted as one or more bit times on the lines 1124 between nodes. A bit time may be the rising or falling edge of the clock signal on the corresponding clock lines. The packets may include command packets for initiating transactions, probe packets for maintaining cache coherency, and response packets from responding to probes and commands.

Processing nodes 1112A-1112D, in addition to a memory controller and interface logic, may include one or more microprocessors. Broadly speaking, a processing node includes at least one microprocessor and may optionally include a memory controller for communicating with a memory and other logic as desired. More particularly, each processing node 1112A-1112D may include one or more copies of microprocessor 1050. External interface unit may include the interface logic 1118 within the node, as well as the memory controller 1116.

According to some embodiments, one or more of processing nodes 1112A-1112D may includes a clock grid driven by virtual lead driver nodes as described herein. For example, processor node 1112A may include a clock grid to supply a clock signal to various functional components within an integrated circuit of processor node 1112A, in one embodiment. As described above, clock signal may be supplied to multiple points, such as virtual leaf driver nodes 520, of a clock grid for processor node 1112A via one or more leaf buffers of a clock tree. Any of various manners of connecting the output of a leaf buffer may be utilized when supplying a clock signal to virtual leaf driver nodes of a clock grid for processor node 1112A, according to various embodiments. For example, in one embodiment, additional feeder elements may connect the output of a leaf buffer to grid lines, at virtual leaf driver nodes, of the clock grid. In another embodiment, the output of one or more leaf buffers may be routed to intermediate grid(s) for further distribution to a main clock grid.

Similarly, any or all of processing nodes 1112B-1112D may also include clock grids driven by virtual leaf driver nodes supplied by leaf buffers of a clock tree, as described herein. Different ones of the processing nodes may utilize different manners of connecting the output of a leaf buffer to a virtual leaf driver node of a clock grid, according to various embodiments. For example, processing nodes 1112B may include a clock grid which is driven by virtual leaf driver nodes connected to leaf buffers directly, while processing nodes 1112C may include multiple feeder elements to route a clock signal from a leaf buffer to virtual leaf driver nodes, according to one embodiment. In general, any and multiple combination of methods and manners for routing clock signals between leaf buffers and virtual leaf driver nodes may be utilized, according to certain embodiments.

Memories 1114A-1114D may include any suitable memory devices. For example, a memory 1114A-1114D may include one or more RAMBUS DRAMs (RDRAMs), synchronous DRAMs (SDRAMs), static RAM, etc. The address space of computer system 400 is divided among memories 1114A-1114D. Each processing node 1112A-1112D may include a memory map used to determine which addresses are mapped to which memories 1114A-114D, and hence to which processing node 1112A-1112D a memory request for a particular address should be routed. In one embodiment, the coherency point for an address within the computer system is the memory controller 1116A-1116D coupled to the memory storing bytes corresponding to the address. In other words, the memory controller 1116A-1116D is responsible for ensuring that each memory access to the corresponding memory 1114A-1114D occurs in a cache coherent fashion. Memory controllers 1116A-1116D may include control circuitry for interfacing to memories 1114A-1114D. Additionally, memory controllers 1116A-1116D may include request queues for queuing memory requests.

Interface logic 1118A-1118L may include a variety of buffers for receiving packets from the link and for buffering packets to be transmitted upon the link. The computer system may employ any suitable flow control mechanism for transmitting packets. For example, in one embodiment, each interface logic 1118 stores a count of the number of each type of buffer within the receiver at the other end of the link to which that interface logic is connected. The interface logic does not transmit a packet unless the receiving interface logic has a free buffer to store the packet. As a receiving buffer is freed by routing a packet onward, the receiving interface logic transmits a message to the sending interface logic to indicate that the buffer has been freed. Such a mechanism may be referred to as a "coupon-based" system.

I/O devices 1120A-1120B may be any suitable I/O devices. For example, I/O devices 1120A-1120B may include devices for communicate with another computer system to which the devices may be coupled (e.g., network interface cards or modems). Furthermore, I/O devices 1120A-1120B may include video accelerators, audio cards, hard or floppy disk drives or drive controllers, SCSI (Small Computer Systems Interface) adapters and telephony cards, sound cards, and a variety of data acquisition cards such as GPIB or field bus interface cards. It is noted that the term "I/O device" and the term "peripheral device" are intended to be synonymous herein.

As used herein, the terms "clock cycle" or "cycle" refer to an interval of time in which the various stages of the instruction processing pipelines complete their tasks. Instructions and computed values are captured by memory elements (such as registers or arrays) according to a clock signal defining the clock cycle. For example, a memory element may capture a value according to the rising or falling edge of the clock signal.

Numerous variations and modifications will become apparent to those skilled in the art once the above disclosure is fully appreciated. It is intended that the following claims be interpreted to embrace all such variations and modifications.

What is claimed is:

1. An integrated circuit, comprising:
a clock grid coupled to a plurality of clocked elements, wherein the clock grid comprises a plurality of conductive traces configured to distribute a clock signal to the plurality of clocked elements, wherein operation of the clocked elements is synchronized according to the distributed clock signal; and a clock tree comprising a plurality of tiers of clock buffers, wherein a final tier of the plurality of tiers of clock buffers comprises a plurality of leaf buffers coupled to the clock grid; and wherein the clock tree is configured to distribute the clock signal to the plurality of conductive traces of the clock grid, wherein an output of at least one of the plurality of leaf buffers is split into a plurality of signal paths, wherein each of the plurality of signal paths is coupled to one or more of the plurality of clock grid traces at a respective distinct location, wherein each respective distinct location serves as a virtual driver of the clock signal to the clock grid at that distinct location.

2. The integrated circuit as recited in claim 1, wherein each of the plurality of signal paths is substantially the same length as each other of the plurality of signal paths.

3. The integrated circuit as recited in claim 1, wherein a propagation delay of the clock signal along each of the plurality of signal paths is substantially the same as a propagation delay along each of the others of the plurality of signal paths.

4. The integrated circuit as recited in claim 1, wherein each of the plurality of signal paths is coupled to the one or more of the plurality of clock grid traces via an intermediate grid, wherein the intermediate grid comprises a plurality of conductive elements coupled to the clock grid at each of the respective distinct locations.

5. The integrated circuit as recited in claim 1, wherein one or more of the plurality of leaf buffers is configured to input the clock signal, wherein the clock signal comprises a plurality of rising edges and a plurality of falling edges, and to output a buffered version of the clock signal, wherein to output the buffered version of the clock signal each of the one or more leaf buffers is configured to drive the plurality of rising edges of the buffered version of the clock signal with a first strength and to drive the plurality of falling edges of the buffered version of the clock signal with a second strength, wherein the first strength differs from the second strength.

6. The integrated circuit as recited in claim 5, wherein each of the one or more leaf buffers is further configured to drive the rising edges with a first strength and drive the falling edges with a second strength based on a type of register being actuated by the buffered version of the clock signal.

7. The integrated circuit as recited in claim 5, wherein each of the one or more leaf buffers is further configured to drive the rising edges with a first strength and drive the falling edges with a second strength based on a type of load being driven by the buffered version of the clock signal.

8. The integrated circuit as recited in claim 5, wherein a value of a W/L ratio for an output pull-up transistor of one of the leaf buffer differs from a value of a W/L ratio for an output pull-down transistor of the leaf buffer.

9. The integrated circuit as recited in claim 5, wherein one of the one or more leaf buffers is configured to drive a plurality of falling edges of a first one of the buffered versions of the clock signal with a third strength and wherein a second one of the one or more leaf buffers is configured to drive a plurality of falling edges of a second one of the buffered versions of the clock signal with a fourth strength, based on a type of load being driven by the respective buffered versions of the clock signal, and wherein the third strength differs from the fourth strength.

10. The integrated circuit as recited in claim 9, wherein a value of a W/L ratio for an output pull-up transistor of the first one of the leaf buffers differs from a value of a W/L ratio for an output pull-up transistor of the second one of the leaf buffers.

11. The integrated circuit as recited in claim 9, wherein a value of a W/L ratio for an output pull-down transistor of the first one of the leaf buffers differs from a value of a W/L ratio for an output pull-down transistor of the second one of the leaf buffers.

12. A method, comprising:
generating a clock signal;
routing the clock signal through a clock tree to a plurality of leaf buffers of the clock tree;
ramifying an output of at least one of the plurality of leaf buffers into a plurality of buffered clock signals;
routing each of the plurality of buffered clock signals along a corresponding plurality of paths; wherein each of the plurality of paths is coupled to the leaf buffer and further coupled to one or more of a plurality of grid lines in a clock grid at a respective distinct location, wherein each respective distinct location serves as a virtual driver of the respective buffered clock signal to the clock grid at that distinct location, wherein the clock grid is configured to route the buffered clock signals to one or more IC components;

wherein each of the plurality of paths imposes a corresponding propagation delay on the corresponding clock signal; and wherein the propagation delay for each of the plurality of paths is substantially the same.

13. The method of claim 12, wherein a terminal end of each of the plurality of paths is connected to one of the plurality of grid lines at a virtual leaf driver node.

14. A method, comprising:
inputting a clock signal to a plurality of leaf buffers, wherein each leaf buffer is part of a final buffer tier in a clock tree, wherein each of one or more of the leaf buffers is configured to distribute the clock signal to a plurality of points on a clock grid, wherein each of the one or more leaf buffers is coupled to one or more elements of the clock grid at two or more of the plurality of points by a different signal path to each respective one of the two or more of the plurality of points, and wherein each of the plurality of points serves as a virtual driver of the clock signal to the clock grid at that point;

wherein the clock signal comprises a plurality of rising edges and a plurality of falling edges; and outputting a buffered version of the clock signal from each of the leaf buffers, wherein said outputting comprises driving the plurality of rising edges of one of the buffered versions of the clock signal with a first strength and driving the plurality of falling edges of the buffered version of the clock signal with a second strength, wherein the first strength differs from the second strength.

15. The method as recited in claim 14, further comprising driving the plurality of rising edges with a first strength and driving the plurality of falling edges with a second strength based on a type of register being actuated by the buffered version of the clock signal.

16. The method as recited in claim 14, wherein a value of a W/L ratio for an output pull-up transistor of one of the leaf buffers differs from a value of a W/L ratio for an output pull-down transistor of the leaf buffer.

17. The method of claim 14, further comprising:
driving the plurality of rising edges for a first one of the buffered versions of the clock signal with a first strength based on a type of load being driving by the first buffered version of the clock signal; and driving the plurality of rising edges of a second one of the buffered versions of the clock signal with a second strength based on a type of load being driven by the second one of the buffered versions of the clock signal, wherein the first strength differs from the second strength.

18. The method as recited in claim 17, wherein said outputting further comprises:
    driving a plurality of falling edges of the first one of the buffered versions of the clock signal with a third strength based on the type of load being driven by the first one of the buffered versions of the clock signal; and
    driving a plurality of falling edges of the second one of the buffered versions of the clock signal with a fourth strength, based on a type of load being driven by the second one of the buffered versions of the clock signal, wherein the third strength differs from the fourth strength.

19. The method as recited in claim 18, wherein a value of a W/L ratio for an output pull-up transistor of the leaf buffer outputting the first one of the buffered versions of the clock signal differs from a value of a W/L ratio for an output pull-up transistor of the leaf buffer outputting the second one of the buffered versions of the clock signal.

20. The method as recited in claim 18, wherein a value of a W/L ratio for an output pull-down transistor of the leaf buffer outputting the first one of the buffered versions of the clock signal differs from a value of a W/L ratio for an output pull-down transistor of the leaf buffer outputting the second one of the buffered versions of the clock signal.

21. A computer system, comprising:
    a system memory; and
    a microprocessor coupled to the system memory, comprising:
        a clock grid coupled to a plurality of clocked elements, wherein the clock grid comprises a plurality of conductive traces configured to distribute a clock signal to the plurality of clocked elements, wherein operation of the clocked elements is synchronized according to the distributed clock signal; and
        a clock tree comprising a plurality of tiers of clock buffers, wherein a final tier of the plurality of tiers of clock buffers comprises a plurality of leaf buffers coupled to the clock grid;
        wherein the clock tree is configured to distribute the clock signal to the plurality of conductive traces of the clock grid; and
        wherein an output of at least one of the plurality of leaf buffers is split into a plurality of signal paths, wherein each of the plurality of signal paths is coupled to one or more of the plurality of conductive traces at a respective distinct location, wherein each respective distinct location serves as a virtual driver of the clock signal to the clock grid at that distinct location.

22. The computer system as recited in claim 21, wherein each of the plurality of signal paths is substantially the same length as each other of the plurality of signal paths.

23. The computer system as recited in claim 21, wherein each of the plurality of signal paths imposes a propagation delay on the clock signal, wherein the propagation delay for each respective signal path is substantially the same as the propagation delay for each other of the plurality of signal paths.

24. The computer system as recited in claim 21, wherein each of the plurality of signal paths is coupled to the one or more of the plurality of clock grid traces via an intermediate grid, wherein the intermediate grid comprises a plurality of conductive elements coupled to the clock grid at each of the respective distinct locations.

25. The computer system as recited in claim 21, wherein one or more of the plurality of leaf buffers is configured to:
    input the clock signal, wherein the clock signal comprises a plurality of rising edges and a plurality of falling edges; and
    output a buffered version of the clock signal, wherein to output the buffered version of the clock signal, each of the one or more leaf buffers is configured to drive the plurality of rising edges of the buffered version of the clock signal with a first strength and to drive the plurality of falling edges of the buffered version of the clock signal with a second strength, wherein the first strength differs from the second strength.

26. The computer system as recited in claim 25, wherein each of the one or more leaf buffers is further configured to drive the rising edges with a first strength and to drive the falling edges with a second strength based on a type of register being actuated by the buffered version of the clock signal.

27. The computer system as recited in claim 25, wherein each of the one or more leaf buffers is further configured to drive the rising edges with a first strength and drive the falling edges with a second strength based on a type of load being driven by the buffered version of the clock signal.

28. The computer system as recited in claim 25, wherein a value of a W/L ratio for an output pull-up transistor of one of one or more the leaf buffer differs from a value of a W/L ratio for an output pull-down transistor of the leaf buffer.

29. The computer system as recited in claim 25, wherein a first one of the one or more leaf buffers is configured to drive a plurality of falling edges of a first one of the buffered versions of the clock signal with a third strength and wherein a second one of the one or more leaf buffers is configured to drive a plurality of falling edges of a second one of the buffered versions of the clock signal with a fourth strength, based on a type of load being driven by the respective buffered versions of the clock signal, and wherein the third strength differs from the fourth strength.

30. The computer system as recited in claim 29, wherein a value of a W/L ratio for an output pull-up transistor of the first one of the leaf buffers differs from a value of a W/L ratio for an output pull-up transistor of the second one of the leaf buffers.

31. The computer system as recited in claim 29, wherein a value of a W/L ratio for an output pull-down transistor of the first one of the leaf buffers differs from a value of a W/L ratio for an output pull-down transistor of the second one of the leaf buffers.

* * * * *